Sept. 19, 1967 H. WAGINI ETAL 3,343,009

THERMOMAGNETIC-EFFECT DEVICES

Filed Aug. 18, 1964 6 Sheets-Sheet 1

Sept. 19, 1967 H. WAGINI ETAL 3,343,009

THERMOMAGNETIC-EFFECT DEVICES

Filed Aug. 18, 1964 6 Sheets-Sheet 2

Sept. 19, 1967 H. WAGINI ETAL 3,343,009

THERMOMAGNETIC-EFFECT DEVICES

Filed Aug. 18, 1964 6 Sheets-Sheet 5

Sept. 19, 1967 H. WAGINI ET AL 3,343,009

THERMOMAGNETIC-EFFECT DEVICES

Filed Aug. 18, 1964 6 Sheets-Sheet 6

United States Patent Office 3,343,009
Patented Sept. 19, 1967

3,343,009
THERMOMAGNETIC-EFFECT DEVICES

Herbert Wagini, Erlangen, and Herbert Weiss, Nurnberg, Germany, assignors to Siemens-Schuckertwerke Aktiengesellschaft, Berlin-Siemensstadt, Germany, and at Erlangen, Germany Filed Aug. 18, 1964, Ser. No. 390,335
Claims priority, application Germany, Nov. 8, 1963, S 88,215
11 Claims. (Cl. 310—4)

Our invention relates to thermoelectric devices and, more specifically, to devices utilizing thermomagnetic phenomena.

The direct conversion of heat to electrical energy, or vice versa, by means of solid-state physical devices, namely the thermoelectric conversion on the basis of the Seebeck and Peltier effects, can reach a theoretical maximum efficiency (Carnot efficiency) determined by the thermoelectric "effectivity" or "figure of merit" of the particular materials. The best thermoelectric materials now known have effectivities whose mathematical product with the absolute temperature reaches up to about unity value, though the product value is not limited thermodynamically. In spite of comprehensive research efforts, no materials of appreciably better effectivities have become available.

It has also become known to directly convert heat to electrical energy, and vice versa, by utilizing thermomagnetic phenomena known as Ettingshausen effect (electric production of a temperature gradient; heat pump) and Ettingshausen-Nernst effect, often (and hereinafter) simply called Nernst effect (generating voltage from heat.) These thermomagnetic methods, as heretofore known, resulted in low effectivity values and a lower efficiency of performance in comparison with the above-mentioned thermoelectric methods on Peltier and Seebeck principles.

It is an object of our invention to improve thermomagnetic devices, such as Ettingshausen heat pumps and Nernst generators, toward considerably higher values of thermomagnetic effectivities (figures of merit) than heretofore attainable.

Another object of the invention is to provide thermomagntic cooling devices capable of furnishing an appreciable and technologically applicable output at higher temperatures and/or lower magnetic-field strengths than the known bismuth-antimony cooling devices of this type.

We have discovered that such objects are achieved by having the thermoelectric solid body of the device consist of a thermomagnetic material, i.e. a material having a Hall mobility differing from zero, which possesses in its interior or on its surface a multiplicity of inhomogeneities as regards electrical conductance.

The inhomogeneities may consist of electrically good conducting strip-shaped areas on those surfaces of the thermomagnetic solid body that extend transverse, preferably perpendicularly, to the direction of the magnetic field to which the body is subjected.

The inhomogeneities may also consist of periodically alternating, parallel regions within the thermomagnetic body having relatively high and low electric conductance respectively, such as obtained by an alternately high and low dopant concentration but not forming any p-n junctions between these regions.

The inhomogeneities may further consist of distributed inclusions in the thermomagnetic body, such inclusions being formed, for example, of a second, electrically good conducting phase segregated in the main phase which consititutes the bulk of the body.

Substances that are to exhibit high values of Nernst effectivity or Ettingshausen effectivity, such as the substances that constitute thermomagnetic bodies in devices according to the invention or the bulk of such bodies, should approach intrinsic conductance as much as feasible or have a narrow forbidden zone. Further desirable are high and nearly equal mobilities of the positive and negative charge carriers (electrons and holes). If these mobilities had the same value, the Hall mobility of intrinsic conductance would be zero. As a rule, however, the charge-carrier mobilities in substances having high thermomagnetic effectivities are rarely equal so that, in almost all cases, a Hall voltage and a Hall mobility are discernible, although often their values are low. It has been found recently that semimetals, for example a bismuth-antimony alloy, exhibit relatively high thermomagnetic effectivity (figure of merit) values (Electronics, September 6, 1963, pages 84 to 88). Relative to such and similar materials, which possess high effectivity even in form of a basic substance, the invention affords considerably improving the efficiency by providing the thermomagnetic bodies of semimetal with electrically good conducting strip areas on the body surface or with the above-mentioned inclusions of good conducting inhomogeneities.

The invention will be further described with reference to the accompanying drawings in which:

FIGS. 1*a* and 1*b* are explanatory, showing a thermomagnetic body with needle-shaped inclusions of good conducting material in a magnetic field and relative to respectively different orientations of the parallel inclusions.

Figures 9, 10:
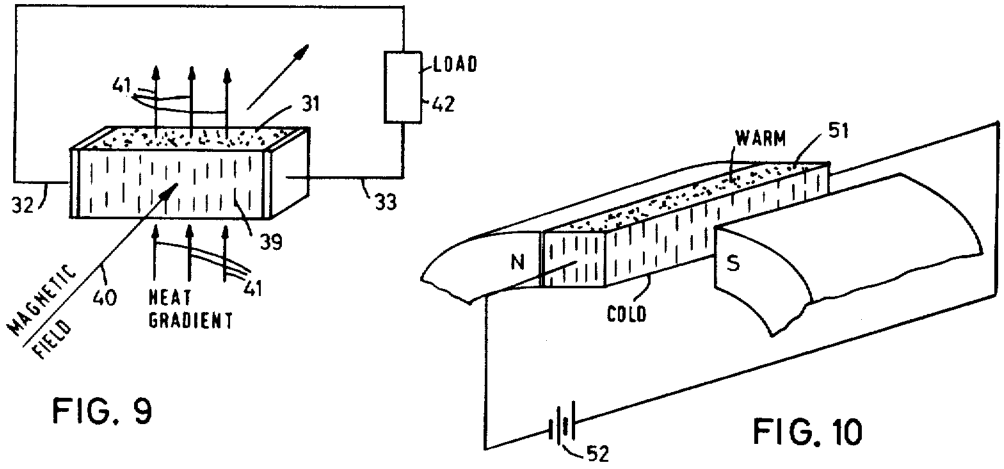

FIG. 9 in an explanatory diagram of a similar generator; and

FIG. 10 is a fragmentary schematic illustration of an embodiment of a thermomagnetic cooling device according to the invention utilizing the Ettingshausen effect.

Figure 8:
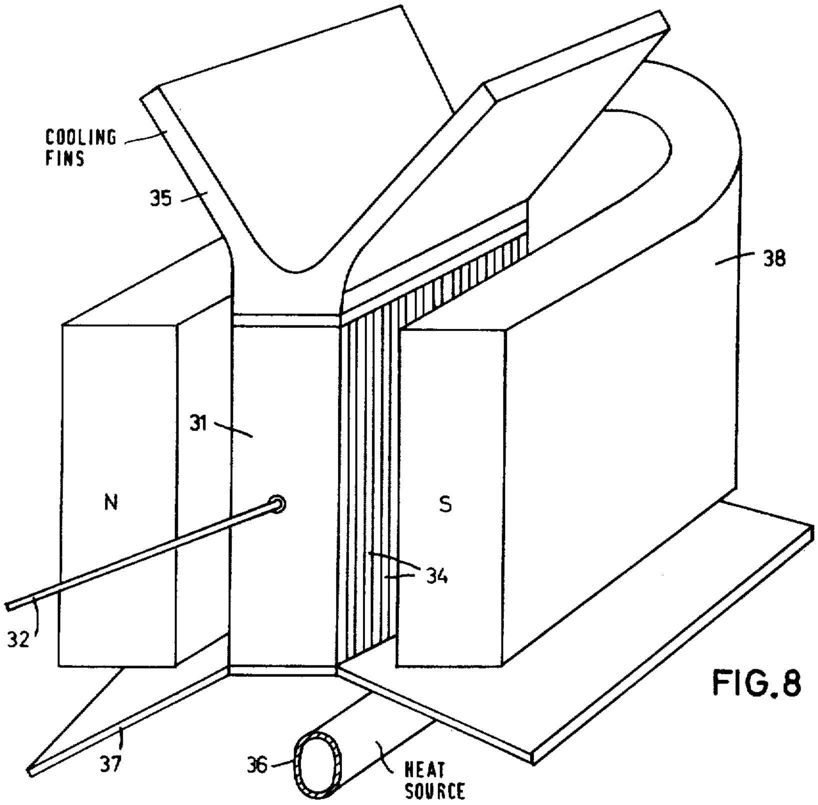
FIG. 8 shows schematically and in perspective an embodiment of a thermomagnetic generator according to the invention utilizing the Nernst effect.

Referring first to FIGS. 8 and 9, the illustrated thermomagnetic generators are each provided with a solid thermomagnetic body 31 consisting, for example, of indium antimonide, or of a bismuth-antimony alloy with 5% antimony, other suitable thermomagnetic materials being mentioned hereinbelow. Two axially opposite sides of the prismatic body 31 are provided with electrodes or contacts to which respective current output leads 32 and 33 are attached for the purpose of providing the generated voltage and applying it to a load 42, such as a measuring instrument, amplifier or other circuit component.

According to FIG. 8, two lateral faces of the thermomagnetic body 31 are provided with narrow strip areas 34 of much better electric conductance than the material of the body 31 itself. The strip areas 34 extend parallel to each other and transverse to the current-flow axis. They may consist of silver which is coated onto, or diffused into, the surface of the body 31. Such strips correspond to those known from U.S. Patent 2,894,234. They may also be produced by alloying.

Attached to one of the remaining faces of the body 31 is a head sink 35 which, in the illustrated embodiment, forms a cooling-fin structure for the purpose of cooling the top face of body 31. The structure 35 is electrically insulated from the body 31 and the strip areas 34. The opposite side of the body 31 is subjected to a heat source 36. The embodiment is shown provided with a shield 37 for concentrating the heat to the warm side of the thermomagnetic body 31 and keeping heat radiation away from the other components of the device.

The thermomagnetic body 31 is mounted in the field gap of a permanent magnet 38 whose poles N and S are shown somewhat bent away from the body 31 for the purpose of illustration. Actually, the field gap is completely filled by the body 31, or pole shoes of ferrite are inserted between the magnet poles and the adjacent faces of the body 31. The strips 34 and the body are insulated from the magnet to prevent short-circuiting.

In operation, the supply of heat to the body causes the generation of voltage between the output leads in accordance with the Nernst effect.

In the similar Nernst-effect generator shown in FIG. 9, the inhomogeneities of the thermomagnetic body 31 consist of a multitude of needle- or scale-shaped inclusions 39 which are statistically distributed throughout the body and oriented parallel to each other in a direction perpendicular to that of the magnetic field indicated in FIG. 9 by an arrow 40. The heat supply is schematically indicated by arrows 41 showing the direction of the heat gradient.

One way of producing the inclusions 39 is to produce the body 31 from a melt of the thermomagnetic material and adding to the melt a substance which, during solidification, causes the segregation of a second phase in the freezing body. Particularly suitable are compositions in which the segregating inclusions have a geometrically anisotropic shape so that they can be oriented during freezing by applying an electric or magnetic field, or preferably by subjecting the solidifying melt to normal freezing (from one end to the other) or producing an ingot and subjecting it to zone melting.

For example, when 1.8% by weight of NiSb is added to a melt of InSb, the homogeneous eutectic melt contains the NiSb dissolved in the InSb. During normal freezing, NiSb segregates out and forms elongated needles oriented in the direction of advancing solidification. The method just described, as well as other suitable materials and methods, are more fully described in the copending application of H. Weiss et al., Serial No. 273,776, filed April 17, 1963, and assigned to the assignee of the present invention.

The embodiment shown in FIG. 10 exemplifies the application of the invention to a cooling device involving the Ettingshausen effect. A body 51 corresponding to the one described above with reference to FIG. 9 is mounted in the field gap between the poles N and S of a magnet, and the current from a source, schematically shown at 52, is passed lengthwise through the thermomagnetic body 51. Now, one of the exposed lateral faces assumes a lower temperature than the other, thus making the device suitable for heat pumping purposes.

For explaining the effect involved in the invention, reference will be made in the following to electrical and thermal transport coefficients in a magnetic field. These coefficients, relating to a rectangular elongated rod of sufficient length in the direction of the primary cause ($x$-axis) and a magnetic field transverse thereto ($z$-axis), are defined relative to a right-hand Cartesian system of coordinates, as follows:

specific electric conductance:

$$\sigma_o^x=\frac{j_x}{E_x}\bigg|dT/dx=0$$

heat conductance:

$$\eta_{ox}=\frac{-c_x}{dT/dx}\bigg|j_x=0$$

isothermal Hall coefficient:

$$R_i^{xy}=\frac{E_y}{j_xB_z}\bigg|dT/dy=0$$

isothermal Nernst coefficient:

$$Q_i^{xy}=\frac{E_y}{B_z dT/dx}\bigg|dT/dy-0$$

Ettingshausen coefficient:

$$P^{xy}=\frac{dT/dy}{j_xB_z};\ P_{yx}=-\frac{dT/dx}{j_yB_z}$$

In these formulas, $j$ denotes the electric current density, $c$ the heat density, E the electric field, B the magnetic induction. The index $i$ characterizes isothermal measuring conditions: $(dT/dy=0)$.

In a two-phase material shaped as an elongated rod and containing the second phase as parallel anisotropic segregations, for example, needle-shaped inclusions, as is the case with the above-mentioned InSb-NiSb material, the following three main orientations relative to a magnetic field are possible:

(a) needles ⊥ cause, ⊥ magnetic induction
(b) needles || cause, ⊥ magnetic induction
(c) needles ⊥ cause, || magnetic induction The term "cause" denotes the applied heat gradient in the case of the Nernst effect (thermomagnetic generator), or the applied voltage in the case of the Ettingshausen effect (thormomagnetic cooler). The orientations (a) and (b) are schematically represented in FIGS. **1*a* and 1*b*** respectively. The orientation (c) is of no significance to devices according to the invention.

Figures 1A, 1B, 2, 3:
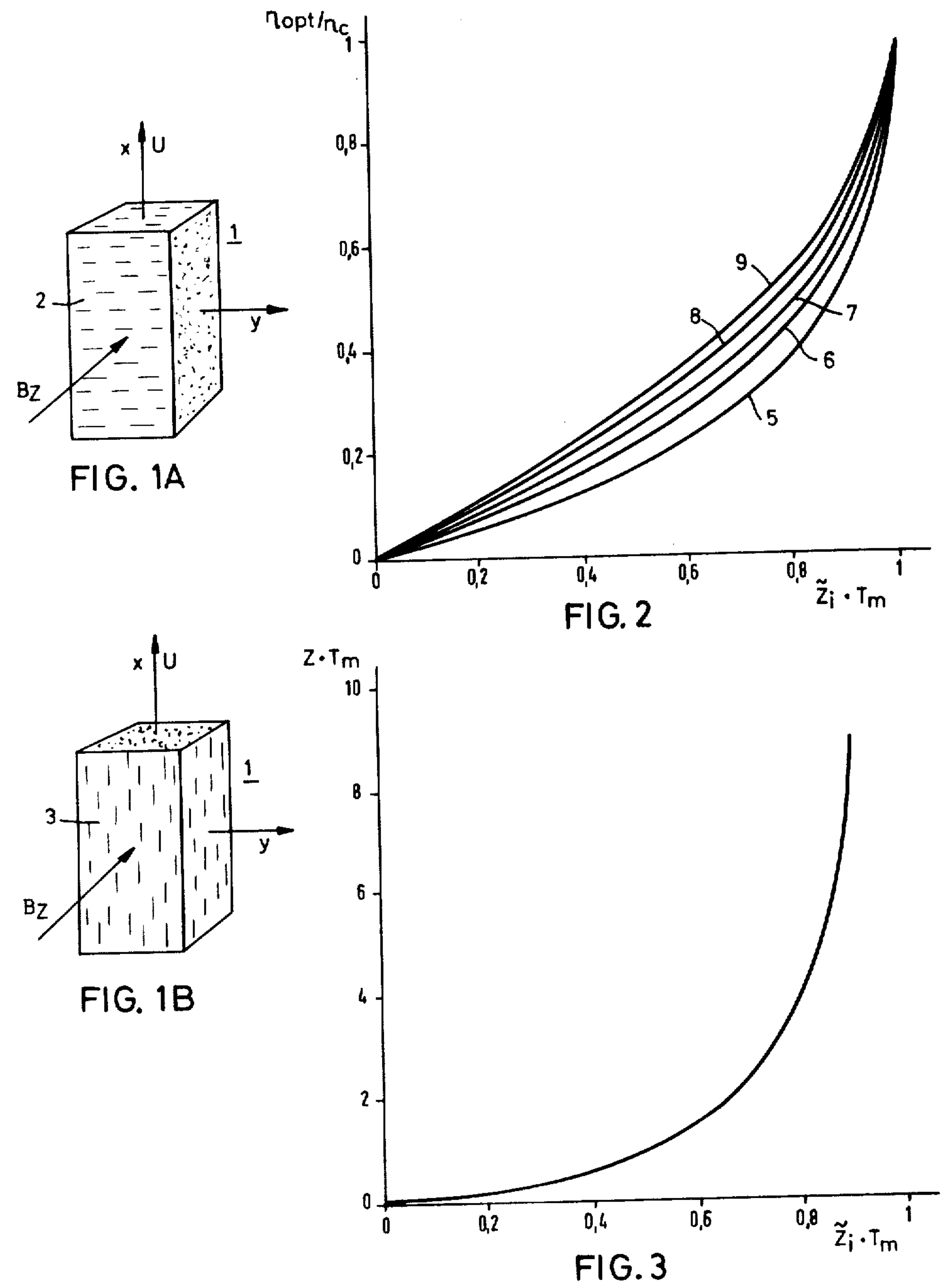
FIGS. 2 through 7 are explanatory graphs of measuring results taken with thermomagnetic devices according to the invention and respectively different orientations as represented by FIGS. 1*a* and 1*b*.

In FIGS. 1*a* and 1*b* the primary cause (temperature gradient or voltage) is denoted by U and extends in the direction of the $x$-axis. The direction of the magnetic induction $B_z$ extends along the $z$-axis. Relative to the $x$–$y$–$z$ coordinate system, the heterogeneous body 1 is so oriented that the needle-shaped inclusions 2 are parallel to the $y$-axis in FIG. 1*a* and parallel to the $x$-axis in FIG. 1*b*. In both cases the needles are perpendicular to the $x$-direction of the magnetic induction.

For anisotropic bodies, the formula for the isothermal Nernst effectivity (figure of merit) upon which the efficiency depends, can be written as follows:

$$\tilde{Z}_i=\frac{(Q_i^{xy}B_z)^2\cdot\sigma_{Bi}^{y}}{\eta_{B_i}^{x}}$$

The first upper indices denote the direction of the primary cause.

The Nernst coefficient and the Ettingshausen coefficient are related to each other in accordance with the Bridgman equation:

$$\frac{Q_i^{xy}T}{\eta_{B_i}^{x}}=P^{yx}$$

It follows from this equation that for optimal operation as thermoelectric generator having the temperature gradient extend in the $x$-direction, the device must be so connected electrically that the electric current flows in the $y$-direction, the coordinate system being thought to be fixed relative to the anisotropic body.

The mathematical product $\tilde{Z}_iT$ has the value 1 as its upper limit because then the Carnot efficiency $\eta_c$ is already attained. This is apparent from FIG. 2 which shows on the abscissa the magnitude $\tilde{Z}_i$.T and on the ordinate the quotient:

$$\frac{\eta_{opt}}{\eta_c}=\frac{1-(1-\tilde{Z}_i\cdot T_m)^{1/2}}{1+T_{k/T_h}(1-\tilde{Z}_i\cdot T_m)^{1/2}}$$

formed by the optical efficiency $\eta_{opt}$ and the Carnot efficiency $\eta_c$. The curves 5, 6, 7, 8 and 9 in FIG. 2 correspond to the respective parameters $T_k/T_h=1$, 0.5, 0.3, 0.1 and 0.01, wherein $T_k$ denotes the colder temperature and $T_h$ the hotter temperature of the Carnot process. The median temperature $T_m$ is defined as $T_m=(T_h+T_k)/2$.

In contrast thereto, and as mentioned above, the absolute differential thermovoltage $\rho_0$ $$Z \cdot T\left(Z=\frac{\varphi_0^2\sigma_0}{\eta_0}\right)$$

is thermodynamically unlimited. However, thermoelectrical and thermomagnetic materials can be compared with each other with respect to their efficiencies, if the following relation is taken into account:

$$Z \cdot T_m=\frac{\tilde{Z}_i \cdot T_m}{1-\tilde{Z}_i \cdot T_m}$$

This comparison is presented in FIG. 3. The abscissa indicates the product of $T_m$ multiplied with the Nernst effectivity $\tilde{Z}_i \cdot T_m$, and the ordinate indicates the product of $T_m$ multiplied with the Peltier effectivity $Z \cdot T_m$, namely:

$$\left(Z=\frac{\varphi_0^2\sigma_0}{\eta_0}\right)$$

Since the best thermoelectric materials so far known have a Z·T value of about 1, a thermomagnetically active substance becomes technologically economically competitive, relative to a given temperature range, if the thermomagnetic $\tilde{Z}_i \cdot T$ value is approximately equal to, or higher than, 0.5. In this respect reference may be had to FIG. 3.

The following tests relate to galvanomagnetic bodies of intrinsically conducting InSb with embedded and oriented needles of NiSb. Pure indium antimonide is completely unsuitable for thermomagnetic purposes in magnetic fields of up to 7 kG (kilo Gauss) and above normal room temperature (20° C.); but as will be shown hereinafter, the invention affords improving the thermomagnetic figure of merit by a great multiple so as to render the materials suitable for testing and other purposes. Hence this material is particularly well suitable as a model substance for artifically strongly anisotropic systems consisting of a base material having a high Hall mobility ($R_H \cdot O_O$) with an embedded and oriented second phase of low Hall mobility but high specific electric conductivity. The specific conductivity of NiSb is about 70,000 (ohm cm.)$^{-1}$, as compared with the 220 (ohm cm.)$^{-1}$ conductivity of intrinsically conducting InSb at normal room temperature (20° C.).

In the tests made, the oriented NiSb needles within the intrinsically conducting InSb had an average length of 50$\mu$ and a diameter of about 1$\mu$. The amount of NiSb was 1.8% by weight. The body was produced as follows:

98.2 g. of InSb were melted together with 1.8 g. of zone-melted NiSb in an elongated quartz boat of semicylindrical inner shape. The melt was kept at 750 to 800° C. for about one hour to make it fully homogeneous. Thereafter the melt was subjected to normal freezing at an advancing rate of 2.7 mm./min. The resulting solid ingot was twice zone melted at a zone travel rate of 1 mm./min. The semicyclindrical body of material thus obtained was cut into rods of the desired size.

The rods were subjected to a magnetic field, and thermomagnetic effects were measured, with the orientations of the segregated inclusions indicated in FIGS. 1*a* and 1*b*, applying a magnetic field from 0 to 7 kG and temperatures of 20° up to about 300° C.

Figure 4:
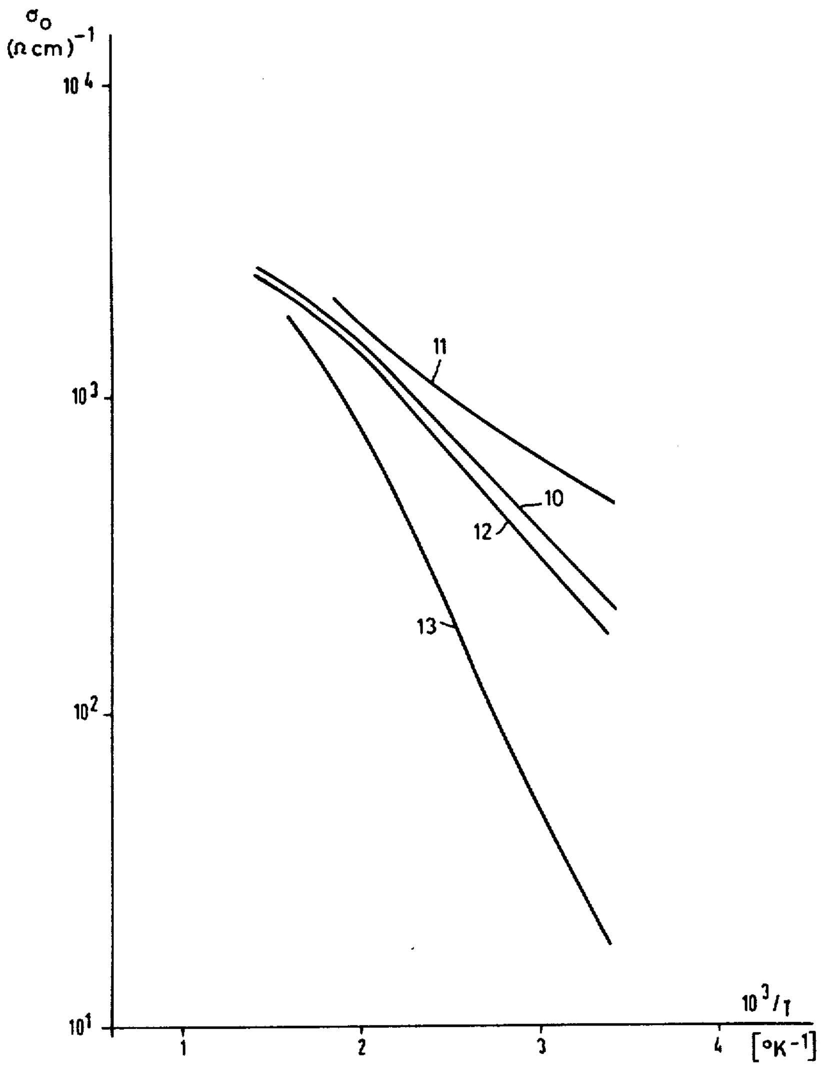

The diagram of FIG. 4 shows on the ordinate the specific electric conductance $\sigma_o$, and the abscissa indicates reciprocal valves of the absolute temperature $10^3/T$. The specimens *a* and *b* mentioned below correspond to the orientations shown in FIGS. 1*a* and 1*b* respectively. Due to the high conductivity of the needles which in specimen *b* extend in the current-flow direction, the specific electric conductivity without magnetic field is twice as high for specimen *b* (curve 11 in FIG. 4) than for specimen *a* (curve 10), the conductivity of specimen *a* being only slightly higher than that of the homogeneous specimen (no inclusions) represented by curve 12. In a magnetic field of 7 kG, the specific electric conductivity of specimen *a* (curve 13) decreases to 8% relative to curve 10 (same specimen at zero field), whereas the conductivity of the homogeneous material (curve 12) is only slightly affected by the magnetic field. These differences correspond to the so-called geometrical resistance change utilized in known galvomagnetic resistors (U.S. Patent 2,894,234).

Figure 5:
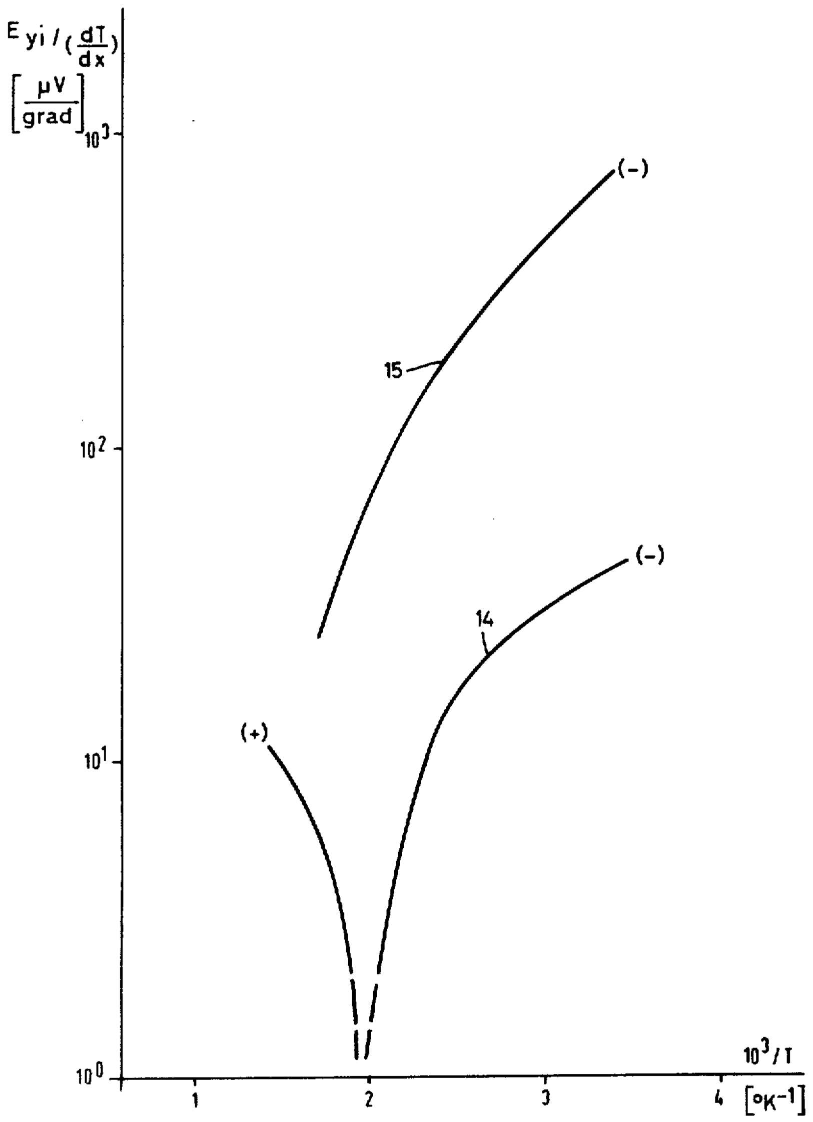

The diagram of FIG. 5 indicates the reciprocal value of the absolute temperature $10^3/T$ along the abscissa. The ordinate indicates the normalized isothermal Nernst voltage $E_{yi}/(dT/dx)=Q_i^{xy} \cdot B_z$. In specimen b (curve 15) the isothermal Nernst voltage at 20° C. and 7 kG increases by the factor 18 relative to the homogeneous material (curve 14). The curve 14 exhibits a zero passage which is characteristic of the Nernst voltage and which occurs for the curve 15 only at higher temepratures and consequently would be located farther at the left.

For investigating whether this increase in isothermal Nernst voltage is geometrically in character, a homogeneous, intrinsically conducting plate of InSb having the dimension 2 x 10 x 30 mm.$^3$ was provided on both broad sides with silver strips extending all the way in the longitudinal direction (see FIG. 1). The width of the strips was 0.3 mm. and the interspaces were 0.7 mm. wide. This grid pattern resulted in increasing the resistance at 7 kG and 20° C. to 5.6 times the previous value. The voltage $E_{yi}/(dT/dx)$ was increased by the silver strips by the factor 11 under the same measuring conditions. This proved that the particular geometry was the main cause for the observed increase in the voltage $E_{yi}/(dT/dx)$. The discovered effect therefore can be designated as "geometrical Nernst effect."

Additionally, we also ascertained the existence of the reverse effect, namely the geometrical Ettingshausen effect in specimen *a* (corresponding to FIG. 1*a*), as well as the applicability of the Bridgman relation within the accuracy limits of the measurement. It was thus ascertained that the thermomagnetic devices according to the invention are also suitable for heat pumps on the Ettingshausen principle.

Figure 6:
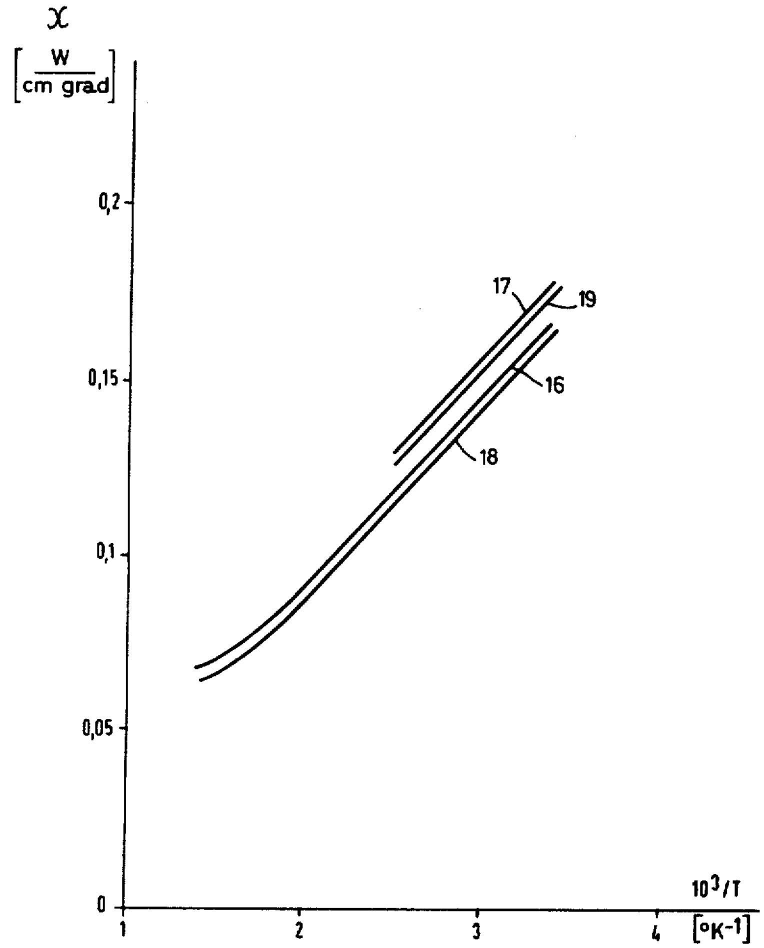

In FIG. 6, the heat conductance along the ordinate is indicated as a function of the absolute reciprocal temperature $10^3/T$ plotted along the abscissa. Curve 16 indicates the heat conductance of the homogeneous material without the magnetic field, and curve 18 the heat conductance of the same material in a magnetic field of 7 kG. The corresponding heat conductance of specimen *b* (oriented in accordance with FIG. 1*b*) is shown by curves 17 and 19 respectively. The heat conductance is not appreciably affected by the anisotropy. The conductance values of curves 17 (specimen *b*) are approximately 6% higher than those of curve 16 relating to the homogeneous material. The effect of a magnetic field of 7 kG upon the heat conductance is likewise not appreciably varied by the anisotropy. This result is important for devices according to the invention because their use requires lowest feasible heat conductance.

Figure 7:
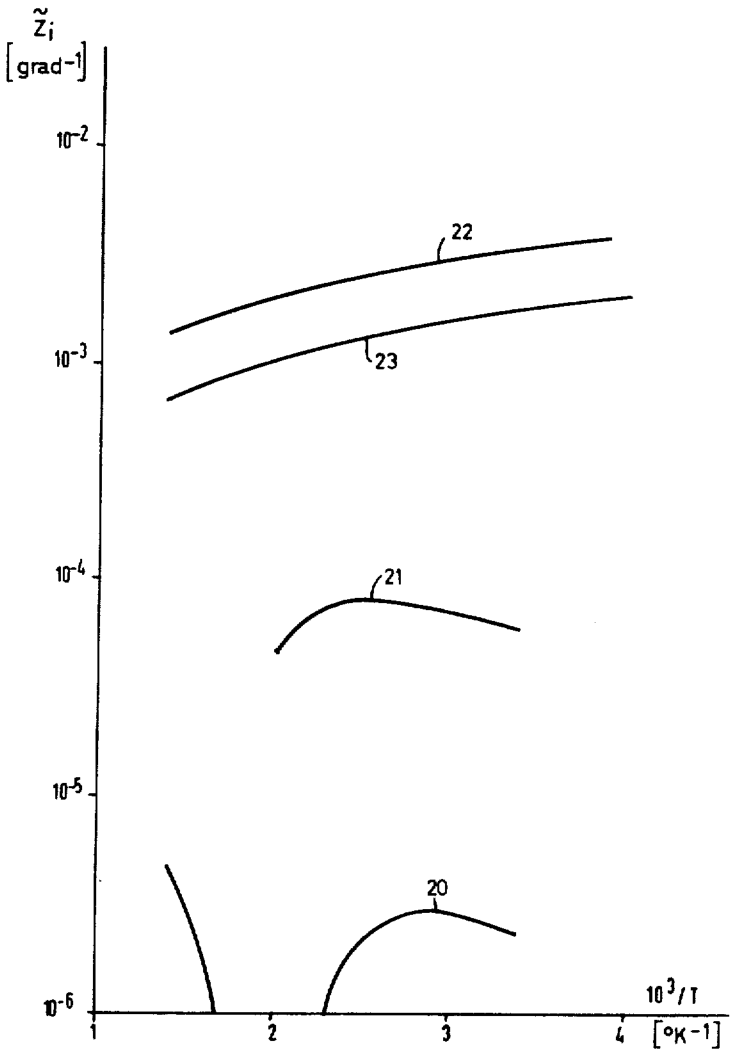

Indicated in FIG. 7 on the ordinate is the isothermal Nernst effectivity at 7 kG versus the reciprocal absolute temperature $10^3/T$ indicated along the abscissa. The curves relate to intrinsically conducting, homogeneous InSb (curve 20) and to anisotropic InSb (curve 21). Curve 21 was obtained from measurements in which the anisotropic InSb body was oriented in accordance with FIG. 1*b*. The two curves 22 and 23 correspond to the product of T times the Nernst effectivities $\tilde{Z}_i \cdot T=1$ and $\tilde{Z}_i \cdot T=0.5$, respectively. Curve 22 corresponds to the Carnot efficiency and thus is the highest possible, whereas curve 23 represents approximately the values heretofore attained by Peltier effectivities.

Since the specific electric conductivity in the direction of the occurring Nernst voltage is reduced by about the same factor by which the geometric Nernst voltage $E_{yi}/(dT/dx)=Q_i^{xy}\cdot B_z$ increases, there still remains for the increase in effectivity $$\tilde{Z}_i=\frac{(Q_i^{xy}\cdot B_z)^2\sigma_{Bi}}{\eta_{Bi}}$$

a similar factor because the Nernst voltage enters with its square value into the formula.

The improvement in effectivity thus attained by virtue of the invention in the case of anisotropic InSb corresponds approximately to the factor 26. Nevertheless, this material still leaves much to be desired for technological use in thermomagnetic devices to operate above normal room temperature in magnetic fields of up to 7 kG, conveniently maintainable with permanent magnets.

However, there are other materials which, even in their homogeneous constitution, exhibit high figures of merit; and these can likewise be improved with respect to efficiency by adding or introducing electrically good conducting regions, inclusions or strip areas on the surface. A requirement for such improvement is that the base material employed have a Hall mobility ($R_H\cdot\sigma_o$) different from zero.

Among applicable base materials are bismuth and bismuth-antimony alloys. For example, an alloy of about 95% bismuth and 5% antimony has a value of $\tilde{Z}_iT=0.4$ and a Hall mobility of $R_H\cdot\sigma_o>10{,}000$ cm.$^2$/Vsec. in a magnetic field of about 10 kG and at temperatures of 80 to 160° K. According to FIG. 3, only a relatively small increase in effectivity of this material is needed to be attained by applying artificial anisotropy in accordance with the present invention for rendering it considerably superior with respect to the results heretofore attainable. Such materials, provided in the above-described manner with a multitude of inhomogeneities of increased electric conductance, permit using them economically for generation of electric current in accordance with the Nernst effect, as well as for heat-pump purposes in accordance with the Ettingshausen effect.

Generally, the materials suitable as a base substance in thermomagnetic bodies according to the invention possess a high and substantially uniform mobility of the charge carriers (electrons and holes) and preferably are intrinsically conducting. Furthermore, these substances should have a narrow forbidden zone so that the intrinsic conductance remains preserved at low temperatures, for example 80° K. Suitable substances of this type, aside from bismuth and bismuth-antimony alloys (with more than 1% and up to about 20% antimony), are mercury telluride, mercury selenide, gray tin, magnesium-lead compounds such as $Mg_2Pb$, cadmium-arsenic compounds such as $Cd_3As_2$, monocrystalline graphite, and also $A^{III}$–$B^{V}$ semiconductor compounds formed by respective elements from the third and fifth B-groups of the periodic system, and $A^{III}B^{IV}C_2^{V}$ compounds formed of respective elements from the third, fourth and fifth B-groups of the periodic system. The base substances whose thermomagnetic effectivity is to be improved by the invention must also meet the requirement that their Hall mobility differs from zero at least in the temperature range in which the materials are to be thermomagnetically active. The use of semimetals, such as bismuth in the above-mentioned bismuth-antimony alloys, is particularly useful for operation at low temperatures such as 100 to 80° K or less. For any given materials, the optimal thermomagnetic performance is also dependent upon the magnetic field strength. Thus, less than 1 kG may be required at the low temperatures just mentioned, whereas the same material achieves maximum effectivity at room temperature only if a field of about 17 kG is applied.

Thermomagnetic solid bodies consisting of the above-mentioned materials can be made heterogeneous in accordance with the present invention by a variety of methods.

One of these methods, applicable to any of the available galvanomagnetic substances, is to provide those surfaces of the body that extend perpendicularly to the magnetic field, with parallel areas of good electrical conductance, preferably in the form of the above-mentioned strips. The strips may consist of silver, copper or indium. They may be deposited by vaporization, alloying of metal foils, or in any other suitable manner. This method results in a thermomagnetic body as exemplified by the one denoted by 31 in FIG. 8. The dimensions and mutual distances of the strips should be as narrow as feasible and may correspond to those exemplified in the foregoing.

Another way of providing for the required hetergeneity with respect to electrical conductance is to produce in the thermomagnetic body of material a multiplicity of sequential layers having alternately higher and lower conductance. This essentially corresponds to a type of body as described in the above-mentioned U.S. Patent 2,894,234 with reference to FIG. 6 of the patent. The alternate layers can be produced by alternately lowering and increasing the dopant concentration in the base material of the body during the production thereof or during zone melting of the body, such methods being generally known as such for other purposes. Striated crystal bodies with periodically alternating regions of higher and lower conductance are also obtained inadvertently when melting and doping a semiconductor material, such as when doping InSb with Te ( A. Müller and M. Wilhelm, in Zeitschrift für Naturforschung, vol. 19, No. 2, page 254, 1964). Such products, heretofore undesirable and not employed in striated constitution are also applicable for the purposes of the present invention.

Still another way of obtaining the desired heterogeneity is to provide the thermomagnetic body with distributed inclusions of anistropic particles or segregations having a higher electric conductance than the base material. This method corresponds to those described in the above-mentioned copending application Ser. No. 273,776 and exemplified in the foregoing with reference to the production of InSb-NiSb material.

As is more fully described in the application Ser. No. 273,776, such anistropic inclusions are obtainable when producing a eutectic melt of the base material with an addition that is miscible with the base material when molten but is not soluble therein when solid. When a homogenous melt of the eutectic composition is permitted to freeze, a second phase will segregate out of the material and can then be oriented by applying an electric or magnetic field or also by normal freezing or zone melting as described above. It is further possible to employ inclusions, such as inclusions of NiSb or MnSb in InSb or other $A^{III}B^{V}$ semiconductor compounds, in conjunction with other materials such as the above-mentioned bismuth-antimony alloys. For this purpose, a body of InSb with inclusions of NiSb is first produced in the above-described manner, whereafter the InSb is chemically dissolved with the result of obtaining a mass of needle-shaped NiSb particles. These particles can then be embedded in a melt of bismuth or bismuth-antimony alloy, or other materials having a lower melting point than NiSb, and the necessary orientation can be effected or improved by normal freezing, zone melting or the application of a suitable field during solidification.

Just in a similar way thin filaments of good conducting material can be embedded in said galvanomagnetic substances. Said good conducting material is only required to be almost unsoluble in the galvanomagnetic substances and to have a higher melting point than the latter. For example said filaments may consist of shorter pieces of thin copper or sliver wires or whiskers.

We claim:

1. A thermomagnetic device comprising magnet means having a field, a thermoelectrically active solid body mounted in said field and having two mutually spaced faces adapted to form relatively warm and cold sides when the device is in operation, electric contacts on two mutually spaced other faces of said body for connecting an external circuit thereto, said body consisting of material having finite Hall mobility and having between said contacts a multiplicity of alternating regions of high and low conductivity respectively, said regions being oriented substantially in parallel relation to one another.

2. In a thermomagnetic device according to claim 1, said differently conductive regions being oriented transversely to the direction of said magnetic field.

3. In a thermomagnetic device according to claim 1, said body having surfaces perpendicular to the direction of said magnetic field, and said regions being formed by parallel strip-shaped areas on said surfaces and extending in transverse relation to the direction of mutual spacing of said contacts.

4. A thermomagnetic device comprising magnet means having a field, a thermoelectrically active solid body mounted in said field and having two mutually spaced faces adapted to form relatively warm and cold sides when the device is in operation, electric contacts on two mutually spaced other faces of said body for connecting an external circuit thereto, said body consisting of a two-phase material, one phase being a substance whose Hall mobility differs from zero and forming the bulk of said body, said second phase consisting of segregated inclusions dispersed and embedded in said one phase and having a higher conductivity than said one phase, said inclusions having anistropic shape and being oriented substantially parallel to one another in a direction transverse to the flow of current between said contacts.

5. In a thermomagnetic device according to claim 4, said inclusions having the shape of needles.

6. In a thermomagnetic device according to claim 4, said inclusions having the shape of scales in respective planes substantially parallel to one another.

7. In a thermomagnetic device according to claim 1, said differently conductive regions being formed by periodically alternating zones of respectively different dopant concentrations in said body.

8. In a thermomagnetic device according to claim 1, said material of said body being a bismuth-antimony alloy with more than 1% and up to 20% by weight of antimony.

9. In a thermomagnetic device according to claim 1, said material of said body being an $A^{III}B^{V}$ semiconductor compound.

10. In a thermomagnetic device according to claim 1, said material of said body being an $A^{III}B^{IV}C_2^{V}$ compound, wherein $A^{III}$ is an element from the third b-group, $B^{IV}$ is an element from the fourth b-group, and $C^{V}$ is an element from the fifth b-group of the periodic system of elements.

11. A thermomagnetic device comprising magnet means having a field gap, a body of substantially prismatic shape having respective electric contacts on two axially spaced faces thereof, said body being mounted in said field gap and having two mutually spaced other faces extending perpendicularly to the field direction in said pap, heat-dissipating structure joined with one of the remaining faces of said body and heat-receiving means at the opposite body face, said body consisting of thermomagnetic material having between said contacts a multiplicity of alternating regions of high and low conductivity respectively, said regions being oriented substantially in parallel relation to one another and transverse to the direction of the current path between said electrodes.

No references cited.

MILTON O. HIRSHFIELD, *Primary Examiner.*

DAVID X. SLINEY, *Examiner.*